US008433276B2

(12) United States Patent
Morishita

(10) Patent No.: US 8,433,276 B2
(45) Date of Patent: Apr. 30, 2013

(54) SAMPLING CIRCUIT AND RECEIVER

(75) Inventor: Yohei Morishita, Tokyo (JP)

(73) Assignee: Panasonic Corporation, Osaka (JP)

( * ) Notice: Subject to any disclaimer, the term of this patent is extended or adjusted under 35 U.S.C. 154(b) by 217 days.

(21) Appl. No.: 13/119,516

(22) PCT Filed: Dec. 3, 2009

(86) PCT No.: PCT/JP2009/006591
§ 371 (c)(1),
(2), (4) Date: Mar. 17, 2011

(87) PCT Pub. No.: WO2010/064436
PCT Pub. Date: Jun. 10, 2010

(65) Prior Publication Data
US 2011/0170640 A1 Jul. 14, 2011

(30) Foreign Application Priority Data

Dec. 3, 2008 (JP) .................... 2008-308953

(51) Int. Cl.
*H04B 1/26* (2006.01)
*G06G 7/12* (2006.01)
(52) U.S. Cl.
USPC ........... 455/323; 455/313; 455/324; 455/325; 327/355; 327/359; 327/361; 375/346
(58) Field of Classification Search .............. 455/323, 455/313, 324, 325, 333, 334, 318, 319, 326, 455/337; 327/113, 355–361, 337; 375/340, 375/346, 316, 334, 336, 337
See application file for complete search history.

(56) References Cited

U.S. PATENT DOCUMENTS

| 5,825,230 | A | * | 10/1998 | Chen et al. ............. 327/337 |
| 7,057,540 | B2 | * | 6/2006 | Muhammad et al. ......... 341/143 |
| 7,079,826 | B2 | * | 7/2006 | Muhammad et al. ......... 455/262 |
| 7,519,135 | B2 | * | 4/2009 | Staszewski et al. ........... 375/346 |

(Continued)

FOREIGN PATENT DOCUMENTS

| JP | 2004/289793 | 10/2004 |
| JP | 2008-11493 | 1/2008 |
| JP | 2008-99224 | 4/2008 |

OTHER PUBLICATIONS

U.S. Appl. No. 13/120,945 to Yohei Morishita, filed Mar. 25, 2011.

(Continued)

*Primary Examiner* — Pablo Tran
(74) *Attorney, Agent, or Firm* — Greenblum & Bernstein, P.L.C.

(57) ABSTRACT

A sampling circuit and a receiver with which filter characteristics compatible with the reception of wideband signals can be realized with a high degree of freedom in the setting of the filter characteristics. More specifically, the sampling circuit is capable of removing adjacent interfering wave signals while keeping in-band deviation small. The sampling circuit is equipped with a discrete-time analog processing circuit group, wherein multiple discrete-time analog processing circuits are connected in parallel, a synthesizer that synthesizes the output signals from each of the circuit systems and outputs same, and a digital control unit that outputs control signals. Each of the discrete-time analog processing circuits is configured to include multiple rotate capacitor units, which each includes a main rotate capacitor and a sub-rotate capacitor, and only the main rotate capacitors share electric charge with a buffer capacitor included in the synthesizer.

8 Claims, 14 Drawing Sheets

U.S. PATENT DOCUMENTS

| | | | |
|---|---|---|---|
| 7,791,407 B2 * | 9/2010 | Muhammad et al. | 327/552 |
| 7,904,048 B2 * | 3/2011 | Lee et al. | 455/307 |
| 7,962,115 B2 * | 6/2011 | Huang et al. | 455/325 |
| 7,982,534 B2 * | 7/2011 | Huang | 327/554 |
| 7,994,850 B2 * | 8/2011 | Burke | 327/554 |
| 8,045,938 B2 * | 10/2011 | Hosokawa et al. | 455/118 |
| 8,164,380 B2 * | 4/2012 | Hosokawa et al. | 327/554 |
| 8,179,185 B2 * | 5/2012 | Hosokawa et al. | 327/355 |
| 2003/0035499 A1 | 2/2003 | Staszewski et al. | |
| 2003/0040294 A1 | 2/2003 | Staszewski et al. | |
| 2003/0080888 A1 | 5/2003 | Staszewski et al. | |
| 2003/0083033 A1 | 5/2003 | Staszewski et al. | |
| 2003/0083035 A1 | 5/2003 | Staszewski et al. | |
| 2003/0083852 A1 | 5/2003 | Staszewski et al. | |
| 2005/0025268 A1 | 2/2005 | Staszewski et al. | |
| 2005/0025269 A1 | 2/2005 | Staszewski et al. | |
| 2005/0025270 A1 | 2/2005 | Staszewski et al. | |
| 2005/0130618 A1 | 6/2005 | Staszewski et al. | |
| 2006/0135107 A1 | 6/2006 | Staszewski et al. | |
| 2009/0009155 A1 | 1/2009 | Hosokawa et al. | |
| 2009/0196384 A1 | 8/2009 | Staszewski et al. | |

OTHER PUBLICATIONS

U.S. Appl. No. 13/122,475 to Yohei Morishita et al., filed Apr. 4, 2011.

U.S. Appl. No. 13/121,244 to Yohei Morishita et al., filed Mar. 28, 2011.

R. B. Staszewski et al., "All-Digital TX Frequency Synthesizer and Discrete-Time Receiver for Bluetooth Radio in 130-nm CMOS", IEEE Journal of Solid-State Circuits, Dec. 2004, pp. 2278-2291, vol. 39, No. 12.

International Search Report for International Application No. PCT/JP2009/006591, mailed Mar. 2, 2010.

* cited by examiner

SAMPLING CIRCUIT AND RECEIVER

TECHNICAL FIELD

The present invention relates to a sampling circuit and a receiver, and, more particularly, to a technology to perform received signal processing such as frequency conversion, filter processing and so forth, by means of discrete time analog processing.

BACKGROUND ART

A configuration has been disclosed that performs reception processing by means of direct discrete time sampling of a high-frequency signal with the aim of achieving small size and low power consumption of a receiver and integrating the analog signal processing section and digital signal processing section (see Patent Literature 1 and Non-Patent Literature 1, for example).

FIG. 1 shows the overall configuration of a sampling circuit disclosed in Patent Literature 1 and Non-Patent literature 1. FIG. 2 is a timing chart showing control signals inputted to the sampling circuit shown in FIG. 1. The sampling circuit shown in FIG. 1 performs frequency conversion on a received analog RF signal using a multi-tap direct sampling mixer to obtain a discrete time analog signal. To be more specific, electrical charge transfer between capacitors included in the sampling circuit in FIG. 1 realizes filter characteristics resulting in the product of an FIR (finite impulse response) filer and an IIR (infinite impulse response) filter. Characteristics around the passband are determined based on second-order IIR filter characteristics. FIG. 3A and FIG. 3B show examples of wideband frequency characteristics and narrowband frequency characteristics nearby the passband in the sampling circuit in FIG. 1.

CITATION LIST

Patent Literature

PTL 1 U.S. Patent Application Laid-Open No. 2003/0035499

Non-Patent Literature

NPL 1 R. B. Staszewski; et al. "All-Digital TX Frequency Synthesizer and Discrete-Time Receiver for Bluetooth Radio in 130-nm CMOS", IEEE Journal of Solid-State Circuits, VOL. 39, NO. 12, December 2004 (p 2284~2287, FIG. 12 to FIG. 16)

SUMMARY OF INVENTION

Technical Problem

However, the conventional sampling circuit as shown in FIG. 1 can obtain only second-order filter characteristics, and therefore has a problem that it is not possible to obtain satisfactory frequency response characteristics when the sampling circuit is attempted to be applied to a wideband radio communication system. To be more specific, when a sampling circuit having the filter characteristics shown in FIG. 3B is attempted to be applied to a wideband radio communication system in which signals in a neighboring channel and other interfering waves exist nearby the band to receive signals, it is not possible to fully attenuate interfering waves, and gain variations occur in the band to receive signals.

In addition, with the configuration shown in FIG. 1, there are only three kinds of capacitance values of history capacitor 3, rotate capacitors 4a to 4h and buffer capacitor 5, which are circuit element values contributing to change in frequency response characteristics of filtering in the sampling circuit. Therefore, filter characteristics obtained by changing these circuit element values are limited, so that it is not possible to flexibly design filter characteristics.

For example, when it is desired to realize frequency response characteristics to secure a greater amount of attenuation for cancelling interfering waves nearby the receiving channel band, it is possible to achieve the frequency response characteristics by increasing the ratio of capacitance values between history capacitor 3 and rotate capacitors 4a to 4h. However, this causes increase in gain variations in the band to receive signals. By contrast with this, when the amount of gain variations in the band to receive signals is attempted to be reduced, it is not possible to secure the amount of attenuation for interfering waves.

As described above, the above-described sampling circuit has a problem that it is not possible to both secure attenuation characteristics in the interfering wave area and reduce the amount of gain variations in the band to pass received signals.

It is therefore an object of the present invention to provide a sampling circuit and a receiver using time analog processing, which are able to realize filter characteristics supporting wideband signal reception and flexibly design filter characteristics.

Solution to Problem

The sampling circuit according to the present invention adopts a configuration to include: a group of a plurality of discrete time analog processing circuits arranged in parallel, each having a sampling switch that samples an inputted signal, a history capacitor connected to the sampling switch and a plurality of rotate capacitor units connected to the history capacitor in parallel; a adding section including: a buffer capacitor that accumulates electrical charge outputted from each of the discrete time analog processing circuits; and a dump switch that controls a connection state between each of the discrete time analog processing circuits and the buffer capacitor; and a digital control unit that outputs a plurality of control signal to control operation of the plurality of rotate capacitor units and operation of the adding section, wherein: each of the plurality of rotate capacitor units has an integration switch, a release switch, and a main rotate capacitor and a sub-rotate capacitor to which the integration switch and the release switch are connected; and at a timing electrical charge accumulated in the history capacitor is inputted to the rotate capacitor unit, the main rotate capacitor and the sub-rotate capacitor are connected to the history capacitor in parallel via the integration switch, and, at a timing electrical charge is outputted from the rotate capacitor unit to the buffer capacitor, only the main rotate capacitor is connected to the release switch.

The sampling circuit according to the present invention adopts a configuration to include: an electrical charge sampling circuit having a sampling switch that samples an inputted signal and a history capacitor connected to the sampling switch; a group of a plurality of discrete time analog processing circuits arranged in parallel, each having a rotate capacitor unit and a buffer capacitor unit; a adding section that adds outputs from the group of the discrete time analog processing circuits and outputs a result; and a digital control unit that outputs a plurality of control signals to control operation of the group of the discrete time analog processing circuits and operation of the adding section, wherein: the rotate capacitor unit has a first integration switch, a main rotate capacitor and a sub-rotate capacitor connected to the first integration switch in parallel; and the buffer capacitor unit has a second integration switch and a buffer capacitor connected to the second integration switch; at a timing electrical charge accumulated in the history capacitor is inputted to the rotate capacitor unit, the main rotate capacitor and the sub-rotate capacitor are connected to the history capacitor in parallel via the first integration switch; and at a timing electrical charge is outputted from the rotate capacitor unit to the adding section, only the main rotate capacitor is connected to the adding section.

Advantageous Effects of Invention

According to the present invention, a circuit configuration is adopted where a plurality of rotate capacitor units each including a main rotate capacitor and sub-rotate capacitor are used as components of a plurality of discrete time analog processing circuits, where only the main rotate capacitor shares electrical charge with a buffer capacitor in the output side, so that it is possible to increase the kinds of element parameters that can be set in the circuit. Therefore, even if the sampling circuit is applied to a wideband radio communication system, it is possible to effectively attenuate interfering waves and reduce gain variations in the band to pass received signals.

DESCRIPTION OF EMBODIMENTS

Now, embodiments of the present invention will be described in detail with reference to the accompanying drawings.

Embodiment 1

Figure 1:
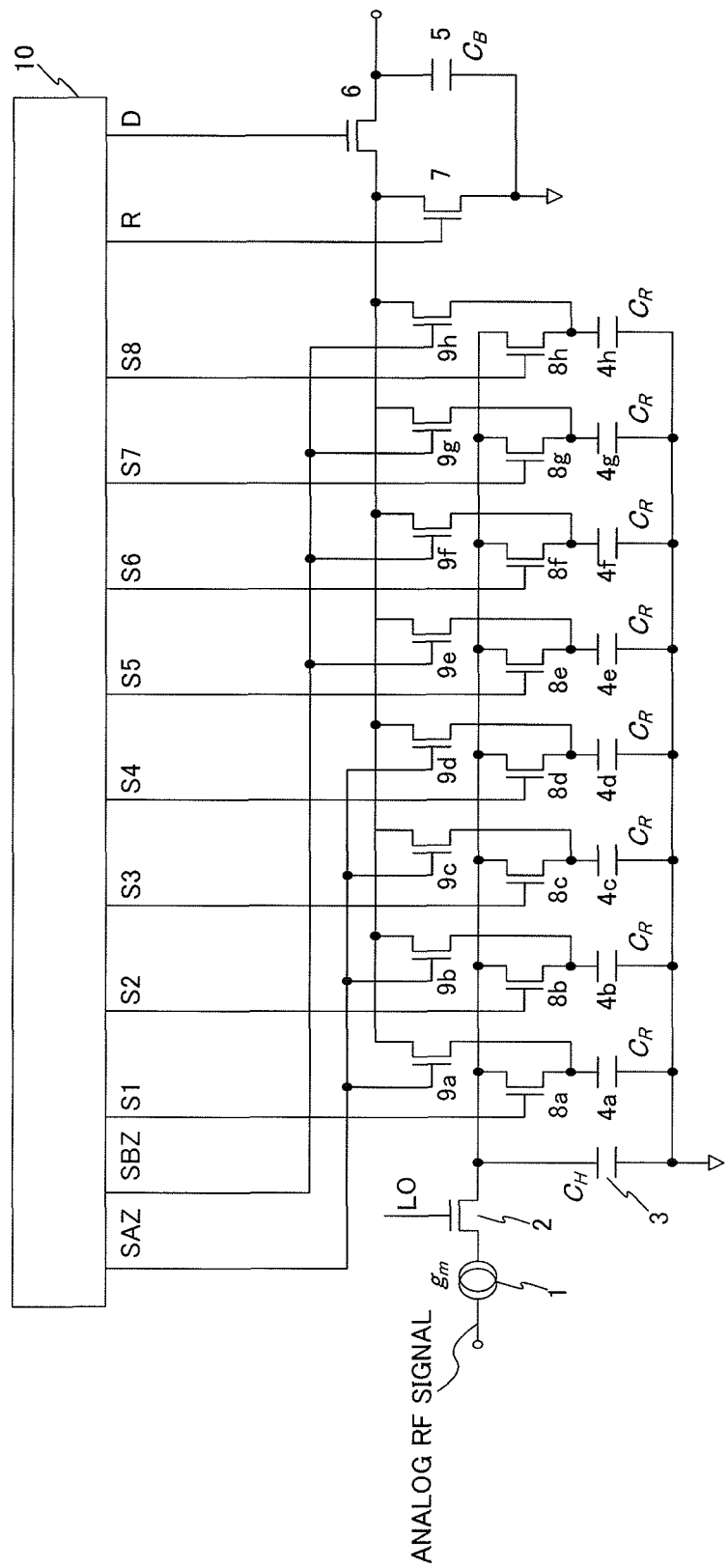
FIG. 1 is a connection diagram showing an example of the configuration of a conventional sampling circuit.
Figure 2:
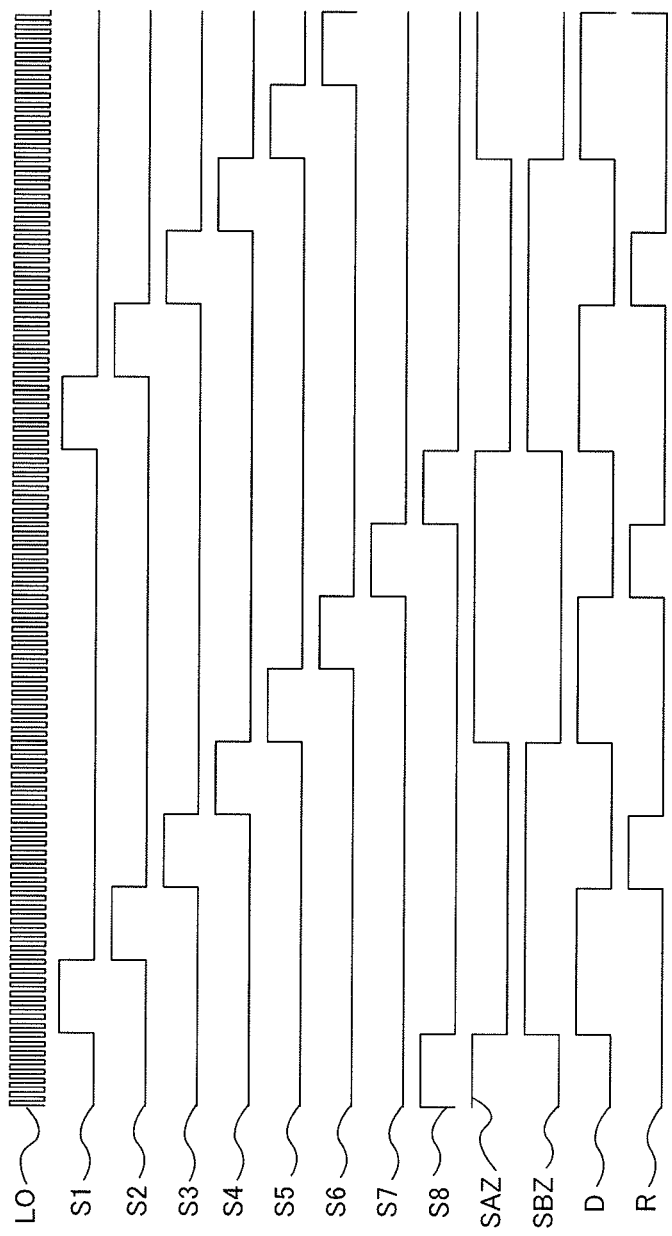
FIG. 2 is a timing chart showing control signals used in the conventional sampling circuit.
Figure 3B:
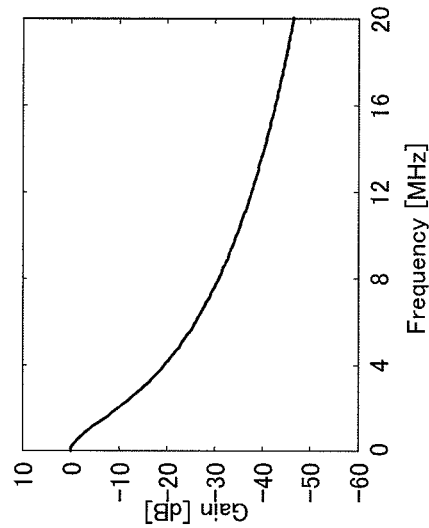
FIG. 3 is a characteristic diagram realized by the conventional sampling circuit.
Figure 3A:
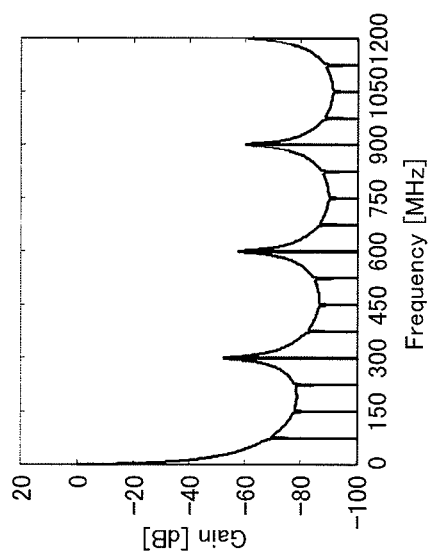
Figure 4:
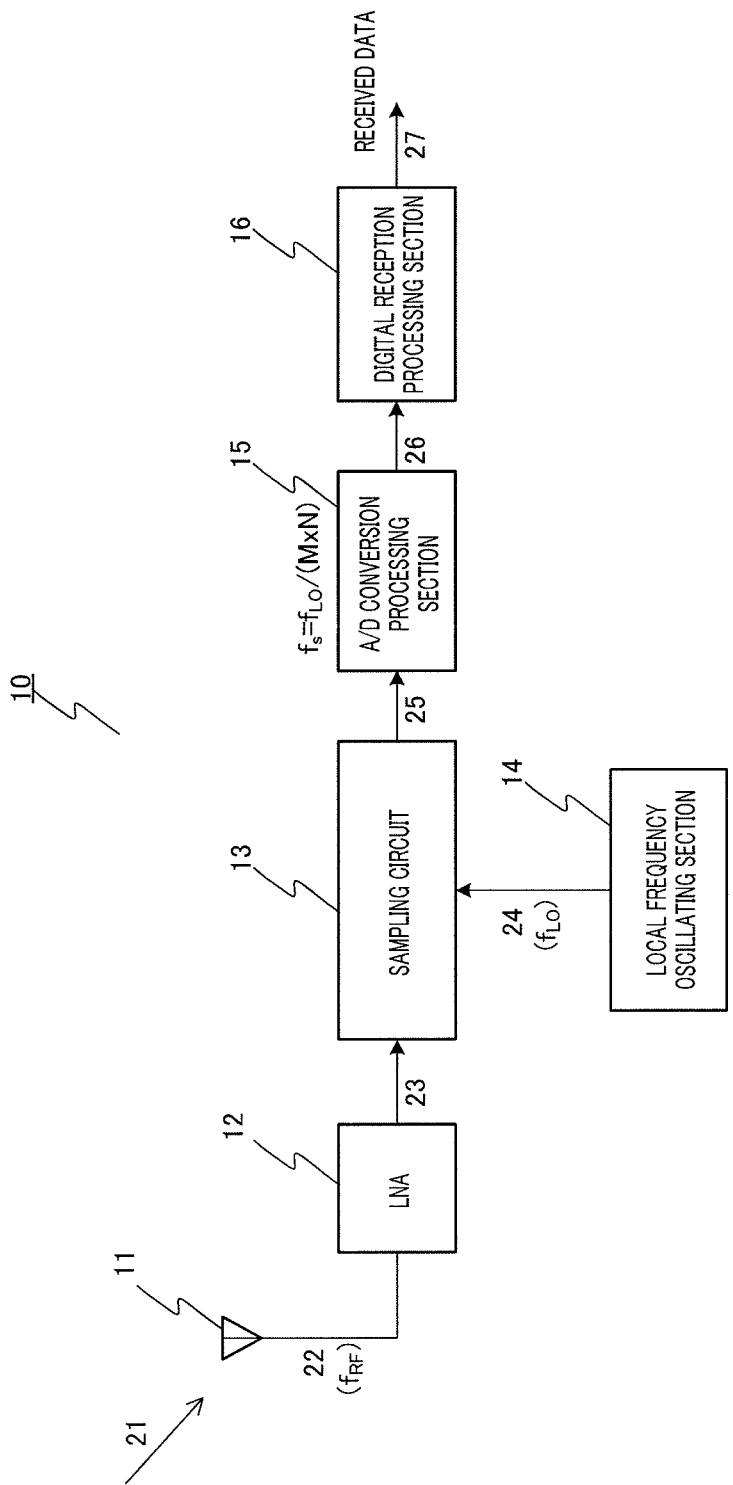
FIG. 4 is a block diagram showing a configuration of a sampling receiver according to Embodiment 1.

FIG. 4 shows the configuration of a sampling receiver according to the present embodiment. Sampling receiver 10 has antenna 11, LNA (low noise amplifier) 12, sampling circuit 13, local frequency oscillating section 14, A/D (analog to digital) conversion processing section 15 and digital reception processing section 16.

This sampling receiver 10 receives electromagnetic wave 21 transmitted at carrier frequency $f_{RF}$, and applies discrete-time frequency conversion and filter processing on this received signal to extract a desired signal component. Then, sampling receiver 10 performs digital reception processing by converting the extracted desired signal component to a digital signal, and outputs resultant received data 27.

Antenna 11 receives electromagnetic wave 21 transmitted at carrier frequency ($f_{RF}$) from a transmitting station (not shown) and converts it to analog RF signal 22. LNA 12 amplifies analog RF signal 22 and outputs the result.

Amplified analog RF signal 23 and local frequency signal 24 are inputted to sampling circuit 13. Sampling circuit performs filter processing by performing discrete-time frequency conversion on analog RF signal 23 using local frequency signal ($f_{LO}$) 24 to obtain baseband signal 25 resulting in extracting a desired signal component, and outputs baseband signal 25.

Local frequency oscillating section 14 generates local frequency signal ($f_{LO}$) 24 used in sampling processing and frequency conversion processing, and outputs it to sampling circuit 13.

A/D conversion processing section 15 quantizes an inputted baseband signal into digital values at a predetermined sampling frequency and outputs digital baseband signal 26 having been converted to a digital signal.

Digital reception processing section 16 performs predetermined digital reception processing, including demodulation, decoding and so forth, on inputted digital baseband signal 26, and outputs resultant reception data 27.

Figure 5:
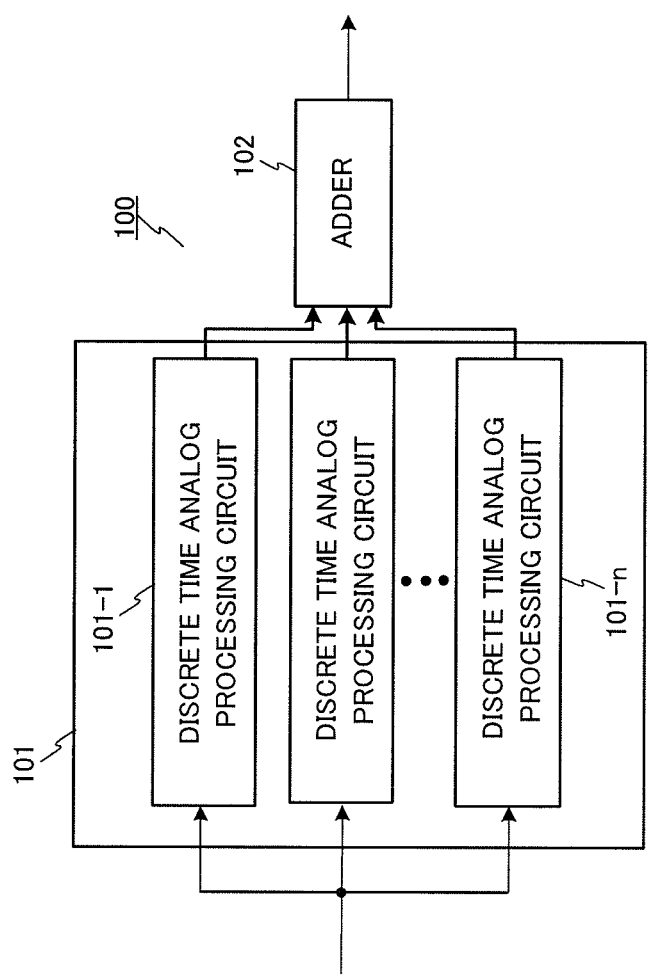
FIG. 5 is a connection diagram showing the configuration of the sampling circuit according to Embodiment 1.

FIG. 5 shows the configuration of sampling circuit 13 in FIG. 4. Sampling circuit 100 in FIG. 5 is equivalent to sampling circuit 13 in FIG. 4. In sampling circuit 100, a plurality of discrete time analog processing circuits 101-1 to 101-$n$ that perform discrete time analog processing on input signals are arranged in parallel. By individually setting circuit element values for respective discrete time analog processing circuits 101-1 to 101-$n$, it is possible to produce better filter frequency response characteristics than in a conventional sampling circuit having a single discrete time analog processing circuit.

<Configuration of a Sampling Circuit>

Figures 6A, 6B:
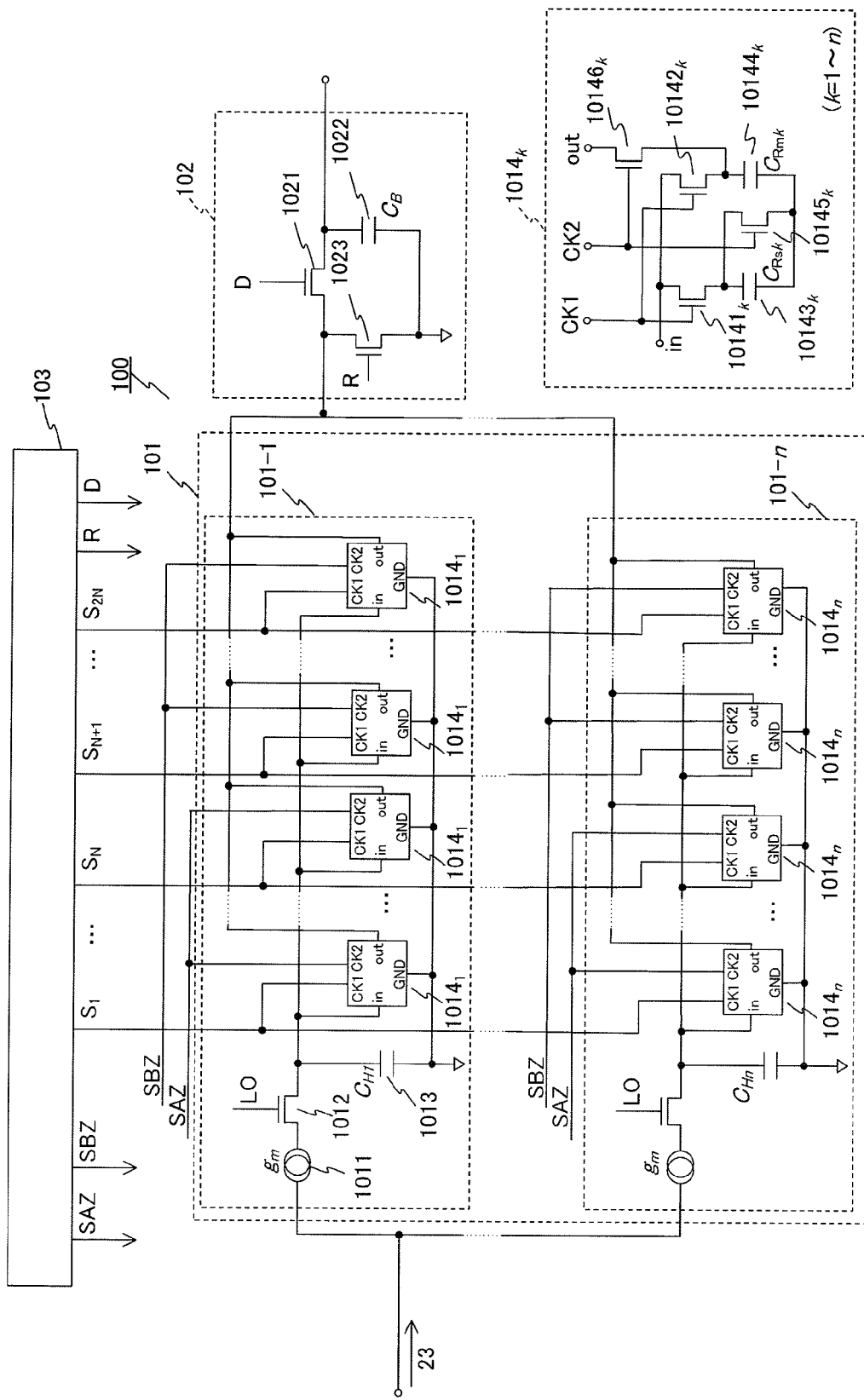
FIG. 6 is a connection diagram showing the specific configuration of the sampling circuit according to Embodiment 1.

FIG. 6 shows the specific configuration of sampling circuit 100 in FIG. 5. Sampling circuit 100 in FIG. 6A has discrete time analog processing circuit group 101 in which n (n sequences of) discrete time analog processing circuits 101-1 to 101-$n$ are connected in parallel, adder 102 and digital control unit 103.

Adder 102 has buffer capacitor 1022, dump switch 1021 that controls connection and disconnection between buffer capacitor 1022 and the plurality of discrete time analog processing circuits 101-1 to 101-$n$ connected in parallel, and reset switch 1023 to ground main rotate capacitors $10144_1$ to $10144_n$ in discrete time analog processing circuits 101-1 to 101-$n$.

In addition, digital control unit 103 generates and transmits control signals to discrete time analog processing circuits 101-1 to 101-$n$, dump switch 1021 and reset switch 1023, respectively.

Next, the configuration of each of discrete time analog processing circuits 101-1 to 101-n will be explained. Discrete time analog processing circuit 101-1 to 101-n have the same configuration, so that discrete time analog processing circuit 101-1 will be explained here.

Discrete time analog processing circuit 101-1 has TA (transconductance amplifier) 1011 that converts an inputted analog RF signal (voltage signal) to a current signal; sampling switch 1012 connected to TA (transconductance amplifier) 1011; history capacitor 1013 connected to sampling switch 1012; and a rotate capacitor unit group composed of a plurality of rotate capacitor units 1014 connected to sampling switch 1012 and history capacitor 1013 in parallel.

FIG. 6B shows the configuration of rotate capacitor unit 1014. Rotate capacitor unit 1014 has sub-rotate capacitor 10143 and main rotate capacitor 10144. Integration switch 10141 and release switch 10145 are connected to sub-rotate capacitor 10143, and integration switch 10142 and release switch 10146 are connected to main rotate capacitor 10144.

Digital control unit 103 generates control signals $S_1$ to $S_{2N}$, SAZ, SBZ, D and R. Control signals $S_1$ to $S_{2N}$ are supplied to integration switches 10141 and 10142 in each rotate capacitor unit 1014. Control signals SAZ and SBZ are supplied to release switches 10145 and 10146 in each rotate capacitor unit 1014. In addition, control signal D and control signal R are supplied to dump switch 1021 and reset switch 1023, respectively.

Any of control signals $S_1$ to $S_{2N}$ is inputted to terminal CK1 and control signal SAZ or SBZ is inputted in terminal CK2 in FIG. 6B. In FIG. 6A, each of discrete time analog processing circuits 101-1 to 101-n has 2×N (N is a natural number equal to or greater than 1) rotate capacitor units 1014. Control signal SAZ is inputted to terminal CK2 of each of left half N rotate capacitor units 1014, among 2×N rotate capacitor units 1014, and control signal SBZ is inputted to terminal CK1 of each of right half N rotate capacitor units 1014. Here, this is merely an example, and the arrangement of rotate capacitor units 1014 to receive control signal SAZ and rotate capacitor units 1014 to receive control signal SBZ is not limited to this.

Here, in each of discrete time analog processing circuits 101-1 to 101-n, the capacitance value of history capacitor 1013, and the capacitance value of sub-rotate capacitor 10143 and the capacitance value of main rotate capacitor 10144 in each rotate capacitor unit 1014 are set based on equations described later. In FIG. 6, in order to clearly show these capacitance values, capacitance $C_H$ of history capacitor 1013, capacitance $C_{Rs}$ of sub-rotate capacitor 10143 and capacitance $C_{Rm}$ of main rotate capacitor 10144 are specified by assigning subscript k (k=1 to n).

Here, as described above, each of discrete time analog processing circuits 101-1 to 101-n has 2×N (N is a natural number equal to or more than 1) rotate capacitor units 1014. Each rotate capacitor unit 1014 has one main rotate capacitor 10144 and one sub-rotate capacitor 10143. One integration switch 10141 and one release switch 10145 are connected to sub-rotate capacitor 10143. Meanwhile, one integration switch 10142 and one release switch 10146 are connected to main rotate capacitor 10144.

Therefore, one discrete time analog processing circuit 101-k includes 2×N rotate capacitor units $\mathbf{1014}_k$, 2×N main rotate capacitors $\mathbf{10144}_k$, 2×N sub-rotate capacitors $\mathbf{10143}_k$, 2×N integration switches $\mathbf{10141}_k$ and $\mathbf{10142}_k$, and 2×N release switches $\mathbf{10145}_k$ and $\mathbf{10146}_k$.

Here, with the present embodiment, although another configuration is possible where capacitors for feedback control and control signals therefor are used, illustrations and descriptions of capacitors for feedback control are omitted for ease of explanation.

Figure 7:
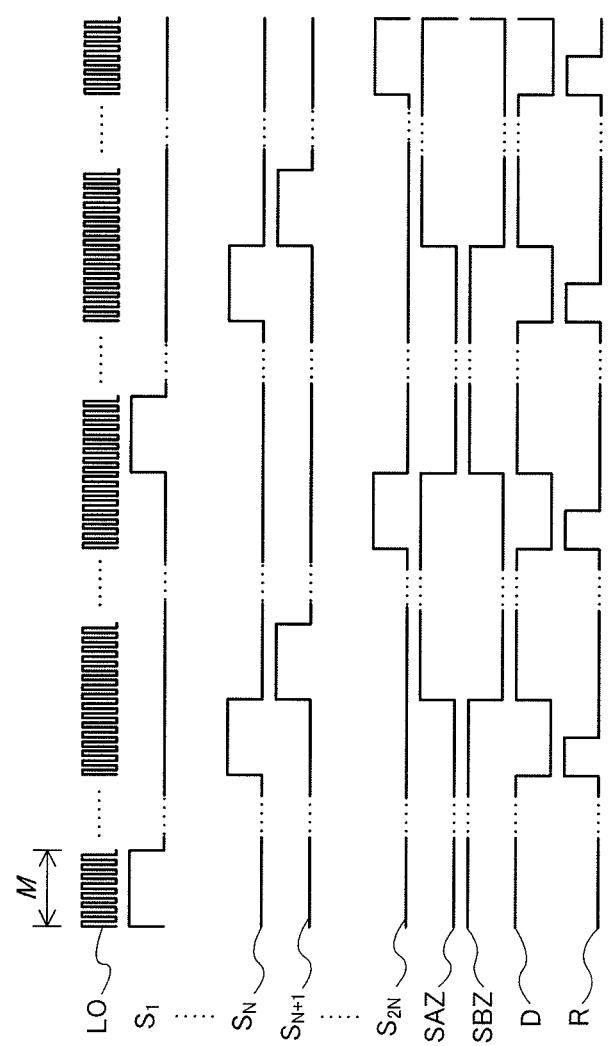
FIG. 7 is a timing chart showing control signals used in Embodiment 1.

FIG. 7 is a timing chart showing control signals outputted from digital control unit 103 and local frequency signals supplied to sampling switch 1012. Control signals $S_1$ to $S_{2N}$ have high level periods shifted from each other, and each high level period is equivalent to M periods of a local frequency signal LO. In addition, control signal SAZ and control signal SBZ alternately come into the high level. Upon receiving these control signals, rotate capacitor unit 1014 performs alternately integration and release of sub-rotate capacitor 10143 and main rotate capacitor 10144, according to on/off states of integration switches 10141 and 10142 and release switches 10145 and 10146.

Here, it is distinctive that, while electrical charge inputted to main rotate capacitor 10144 during integration switch 10142 being turned on, is partly released to buffer capacitor 1022 upon turning release switch 10146 on, electrical charge inputted to sub-rotate capacitor 10143 during integration switch 10141 being tuned on, is grounded and discharged at the timing release switch 10145 is turned on.

In this way, by using main rotate capacitor 10144 sharing electrical charge with buffer capacitor 1022 and sub-rotate capacitor 10143 not sharing electrical charge with buffer capacitor 1022, it is possible to switch the capacitance value of rotate capacitor unit 1014 between the time to input electrical charge and the time to output electrical charge. By this configuration, even if discrete time analog processing circuits 101-1 to 101-n share common TA (transconductance amplifier) 1011, it is possible to control respective gains. By this means, when a circuit to realize filter characteristics having attenuation poles described later is designed, it is possible to control attenuation pole frequencies by capacitance ratios.

Here, adder 102 is not necessarily realized with a passive configuration by means of electrical charge sharing using buffer capacitor 1022 shown in FIG. 6. For example, it is possible to prepare the same number of buffer capacitors 1022 as the number of parallel discrete time analog processing circuits 101-1 to 101-n, and output signals from buffer capacitors 1022 by means of an adding circuit using an operational amplifier.

Here, the present invention does not limit what circuit configuration after buffer capacitor 1022 is. For example, a circuit configuration is possible in which a discrete signal value defined by the amount of electrical charge accumulated in buffer capacitor 1022 is quantized into a digital value while holding the discrete signal value as is (sampling and holding), and then digital signal processing is performed. In addition, for example, another configuration is possible in which a discrete signal value defined by the amount of electrical charge accumulated in buffer capacitor 1022 is converted to a voltage, and then signal processing is performed.

<Operation of a Sampling Circuit>

Next, operation of sampling circuit 100 according to the present embodiment will be explained. In each of discrete time analog processing circuits 101-1 to 101-n, inputted analog RF signal 23 is converted to an analog RF current signal by means of TA (transconductance amplifier) 1011, and sampled with local frequency signal ($f_{LO}$) 24 having approximately the same frequency LO as that of the analog RF current signal by means of sampling switch 1012. Moreover, in each of discrete time analog processing circuits 101-1 to 101-n in sampling circuit 100, electrical charge of sampled signals is integrated and shared between history capacitor 1013, and sub-rotate capacitor 10143 and main rotate capacitor 10144 in rotate capacitor unit 1014 to form a discrete time signal.

Moreover, in each of discrete time analog processing circuits 101-1 to 101-$n$, integration switch 10141 and integration switch 10142 and release switch 10145 and release switch 10146 in rotate capacitor unit 1014 are controlled on and off between history capacitor 1013, and sub-rotate capacitor 10143 and main rotate capacitor 10144 in rotate capacitor unit 1014, so that the operation equivalent to the first FIR filter characteristic and the second FIR filter characteristic is performed.

Here, the first FIR filter characteristic is determined by the time length for a high level period of each of control signals $S_1$ to $S_{2N}$ in each of a plurality of discrete time analog processing circuit 101-1 to 101-$n$. That is, the first FIR filter characteristic is determined by the time length for integration by charging and electrical charge sharing between history capacitor 1013, and sub-rotate capacitor 10143 and main rotate capacitor 10144 in rotate capacitor unit 1014. With the present embodiment, the time length for integration corresponds to M periods of a local frequency LO, so that it is possible to represent the transfer function of the first FIR filter characteristic realized in each discrete time analog processing circuit by equation 1.

(Equation 1)

$$H_{FIR1\_k} = \frac{1}{M} \cdot \frac{1-z^{-M}}{1-z^{-1}} \quad [1]$$

In addition, the second FIR filter characteristic is determined by the number N of main rotate capacitors 10144 selected by control signal SAZ or SBZ, among 2×N main rotate capacitors 10144 in rotate capacitor unit 1014, and the value of the above-described M, regardless of the capacitance value of each capacitor used in each of a plurality of discrete time analog processing circuits 101-1 to 101-$n$. It is possible to represent the transfer function of the second FIR filter characteristic realized in each discrete time analog processing circuit by equation 2.

(Equation 2)

$$H_{FIR2\_k} = \frac{1}{N} \cdot \frac{1-z^{-MN}}{1-z^{-M}} \quad [2]$$

In addition, in each of a plurality of discrete time analog processing circuits 101-1 to 101-$n$, electrical charge is shared between history capacitor 1013 and the capacitors connected to history capacitor 1013 by control signals $S_1$ to $S_{2N}$ supplied to integration switches 10141 and 10142, among sub-rotate capacitors 10143 and main rotate capacitors 10144 in a plurality of rotate capacitor units 1014. Then, the results of electrical charge sharing accumulated in main rotate capacitors 10144 in each discrete time analog processing circuit are added by electrical charge sharing in subsequent adder 102 to realize the first and second IIR filters.

This first IIR filter characteristic is obtained by sharing among $C_{Rmk}$, $C_{Rsk}$, $C_{Hk}$ and the electrical charge inputted from TA (transconductance amplifier) 1011 and the electrical charge accumulated in $C_{Hk}$ resulting from electrical charge sharing one timing before. It is possible to represent this transfer function by equation 3. Here, sub-rotate capacitor 10143 is not connected to buffer capacitor 1022. By this means, in each of discrete time analog processing circuits 101-1 to 101-$n$, numerator coefficients of a transfer function are determined by the ratio of the capacitance of main rotate capacitor 10144 to the capacitance of history capacitor 1013. In addition, denominator coefficients of a transfer function are determined by the ratio of a total sum of the capacitance of main rotate capacitor 10144 and sub-rotate capacitor 10143 to the capacitance of history capacitor 1013.

To be more specific, in equation 3, these proportions are described as $C_{Rmk}/C_{Hk}$ in the numerator and $(C_{Rmk}+C_{Rsk})/C_{Hk}$ in the denominator after $\Sigma$. It is possible to individually set these ratios, according to the capacitances of main rotate capacitor 10144 and sub-rotate capacitor 10143, and it is possible to set coefficients of a transfer function based on capacitance ratios. Capacitance ratios are accurate in manufacture by means of semiconductor process and allow accurate coefficient setting.

(Equation 3)

$$H_{IIR1} = \frac{Mg_m T_S}{\pi \sum_{k=1}^{n} C_{Rmk}} \cdot \sum_{k=1}^{n} \frac{z^{-M} C_{Rmk}/C_{Hk}}{(C_{Rmk}+C_{Rsk})/C_{Hk}+1-z^{-M}} \quad [3]$$

Here, in equation 3, $T_s$ is the time length for the sampling period of sampling with local signal frequency LO in sampling switch 1012. In addition, $g_m$ is the transconductance value of TA (transconductance amplifier) 1011 in each of discrete time analog processing circuits 101-1 to 101-$n$. In addition, $C_{Hk}$ is the capacitance value of history capacitor 1013 in k-th (k is a natural number from 1 to n) of discrete time analog processing circuits 101-$k$. In addition, $C_{Rmk}$ is the capacitance value of one sub-rotate capacitor 10143 in k-th discrete time analog processing circuits 101-$k$. In addition, $C_{Rsk}$ is the capacitance value of one main rotate capacitor 10144 in k-th of discrete time analog processing circuits 101-$k$.

Moreover, electrical charge is shared between buffer capacitor 1022 and main rotate capacitor 10144 connected to buffer capacitor 1022 by control signal SAZ or SBZ supplied to release switch 10146 in rotate capacitor unit 1014, among main rotate capacitors 10144 in a plurality of rotate capacitor units 1014. The second IIR filter characteristic is realized by this electrical charge sharing between main rotate capacitor 10144 and buffer capacitor 1022. It is possible to represent its transfer function by equation 4. In equation 4, $C_B$ represents the capacitance value of buffer capacitor 1022.

(Equation 4)

$$H_{IIR2} = \frac{\sum_{k=1}^{n} NC_{Rmk}/C_B}{\sum_{k=1}^{n} NC_{Rmk}/C_B + 1 - z^{-MN}} \quad [4]$$

Here, the terms are not distinctly separated in equations 1 to 4, but organized for ease of explanation of a method of designing filter characteristics of a sampling circuit described later. To be accurate, the addition in equation 3 is realized at the same time as the second IIR filter characteristic is realized.

As described above, total transfer characteristic H(z) of filtering processing obtained in the entire sampling circuit 100 shown in FIG. 6A is represented as the characteristic obtained by combining the characteristics of equation 1 to equation 4, and can be substituted for equation 5.

(Equation 5)

$$H(z) = \frac{1}{M} \cdot \frac{1-z^{-M}}{1-z^{-1}} \cdot \frac{1}{N} \cdot \frac{1-z^{-M \times N}}{1-z^{-M}} \cdot \quad [5]$$

$$\frac{Mg_m T_S}{\pi \sum\limits_{k=1}^{n} C_{Rmk}} \sum_{k=1}^{n} \frac{z^{-M} C_{Rmk}/C_{Hk}}{(C_{Rmk}+C_{Rsk})/C_{Hk}+1-z^{-M}} \cdot$$

$$\frac{\sum\limits_{k=1}^{n} NC_{Rmk}/C_B}{\sum\limits_{k=1}^{n} NC_{Rmk}/C_B+1-z^{-MN}}$$

It is important that, in the transfer function represented by equation 5, if capacitance values $C_{Hk}$, $C_{Rmk}$, $C_{Rsk}$ and $C_B$ of respective capacitors in n discrete time analog processing circuits 101-1 to 101-$n$ are set at random, it is not possible to obtain desired filter frequency response characteristics.

In particular, it is possible to understand that the first IIR filter characteristic represented by equation 3 is the sum of first-order IIR filter characteristics. To be short, it is possible to describe as equation 6. In equation 6, constant $a_k$ corresponds to $C_{Rmk}/C_{Hk}$ in equation 3, and constant $b_k$ corresponds to $(C_{Rmk}+C_{Rsk})/C_{Hk}$ in equation 3. Therefore, it is possible to determine constant $a_k$ and constant $b_k$ based on the capacitances of main rotate capacitor 10144 sub-rotate capacitor 10143, respectively.

(Equation 6)

$$H_{IIR3} = \sum_{k=1}^{n} \frac{a_k}{b_k+1-z^{-M}} \quad [6]$$

By calculating constants $a_k$ and $b_k$ using DC gains, the positions of attenuation poles and so forth, which are set at random, and comparing $H_{IIR1}$ in equation 3 and $H_{IIR3}$ in equation 6, it is possible to calculate the values of $g_m$, $C_{Rmk}$, $C_{Rsk}$ and $C_{Hk}$. A specific method of selecting element values will be described in Embodiment 2.

Meanwhile, it is significantly difficult to accurately make the difference of transconductance value $g_m$ of TA (transconductance amplifier) 1011 between each circuit. Therefore, in the configuration shown in FIG. 6A, $g_m$ of TA (transconductance amplifier) 1011 is the same value between each of discrete time analog processing circuits 101-1 to 101-$n$. By this means, it is possible to greatly reduce design difficulties as compared to a case in which discrete time analog processing circuits have TAs (transconductance amplifiers) 1011 having different $g_m$ values. In addition, each of discrete time analog processing circuits 101-1 to 101-$n$ has one TA (transconductance amplifier) 1011, so that it is possible to produce an effect of increasing gain as compared to a case in which one TA (transconductance amplifier) 1011 is used across entire sampling circuit 100.

As described above, according to the present embodiment, a circuit configuration is adopted where a plurality of discrete time analog processing circuits 101-1 to 101-$n$ are connected in parallel, electrical charge signals obtained in each of discrete time analog processing circuits 101-1 to 101-$n$ are weighted by the capacitance ratio between main rotate capacitor 10144 and sub-rotate capacitor 10143 and adding the results in buffer capacitor 1022. By this means, it is possible to increase the order of the IIR filter realized in sampling circuit 100.

Moreover, by using main rotate capacitor 10144 and sub-rotate capacitor 10143, it is possible to perform weighting by the capacitance ratio appropriate for semiconductor process in high-order IIR filter design for sampling circuit 100. In addition, the kinds and the number of circuit element values that can be set in filter design increase, so that it is possible to dramatically increase the flexibility of filter design. In particular, by adequately setting the number n of discrete time analog processing circuits 101-1 to 101-$n$ provided in parallel, depending on the filter performance required for a receiver, it is possible to randomly set the number of attenuation poles and the positions in the frequency domain, and therefore it is possible to realize filter characteristics supporting reception of wideband signals.

Here, in FIG. 6, a case has been explained where, in each of n discrete time analog processing circuits 101-1 to 101-$n$, capacitance values $C_{Rsk}$ of sub-rotate capacitors 10143 in rotate capacitor units 1014 are the same value in one discrete time analog processing circuit, and also capacitance values $C_{Rmk}$ of main rotate capacitors 10144 in rotate capacitor units 1014 are the same value in one discrete time analog processing circuit, but capacitance values $C_{Rsk}$ and capacitance values $C_{Rmk}$ are respectively different between different discrete time analog processing circuits. However, the present invention is not necessarily limited to this.

In addition, in one discrete time analog processing circuit, it is possible to make respective capacitance values of main rotate capacitors 10144 differ and also make respective capacitance values of sub-rotate capacitors 10144 differ between a plurality of rotate capacitor units 1014. In this case, the transfer function varies, so that it is necessary to change the method of designing filter characteristics of a sampling circuit, according to the present embodiment. In addition, it is reasonable to use one of discrete time analog processing circuits requiring the greatest necessary amplitude gain, as the reference for weighting, without providing sub-rotate capacitor 10143.

With the configuration according to the present embodiment, although a case has been explained as an example where local frequency signals LO are generated not only in digital control unit 103 and supplied to sampling switch 1012, the present invention is not limited to this. Another configuration is possible where local frequency signals LO are generated in digital control unit 103 and supplied to sampling switch 1012.

With the configuration according to the present embodiment, although a case has been explained where, after electrical charge sharing, main rotate capacitor 10144 and sub-rotate capacitor 10143 are grounded by reset switch 1023, electrical charge may be held without grounding. It is possible to improve gain by holding electrical charge without grounding. It is possible to reduce the number of switches and control signals to simplify the circuit configuration.

Figure 8:
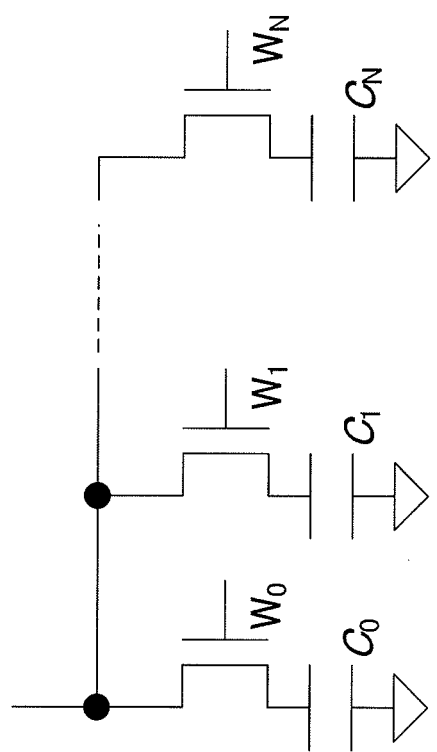
FIG. 8 shows a configuration of a variable capacitance capacitor according to Embodiment 1.

In addition, a configuration is possible where the capacitance value of each of main rotate capacitor 10144, sub-rotate capacitor 10143, history capacitor can be changed. For example, as shown in FIG. 8, by controlling switch W(i) (i=1~N) on and off to determine the entire capacitance, it is possible to change gains, cutoff frequencies and attenuation pole frequencies with a single circuit configuration. Here, the entire circuit configuration shown in FIG. 8 is equivalent to one capacitor.

Embodiment 2

With the present embodiment, examples of circuit configurations and realized filter characteristics in discrete time analog processing circuits in parallel shown in Embodiment 1, will be explained, where the number of circuits to be in parallel is 3. In addition, with the present embodiment, appropriate configuration requirements will be presented in this case.

Figures 9A, 9B:
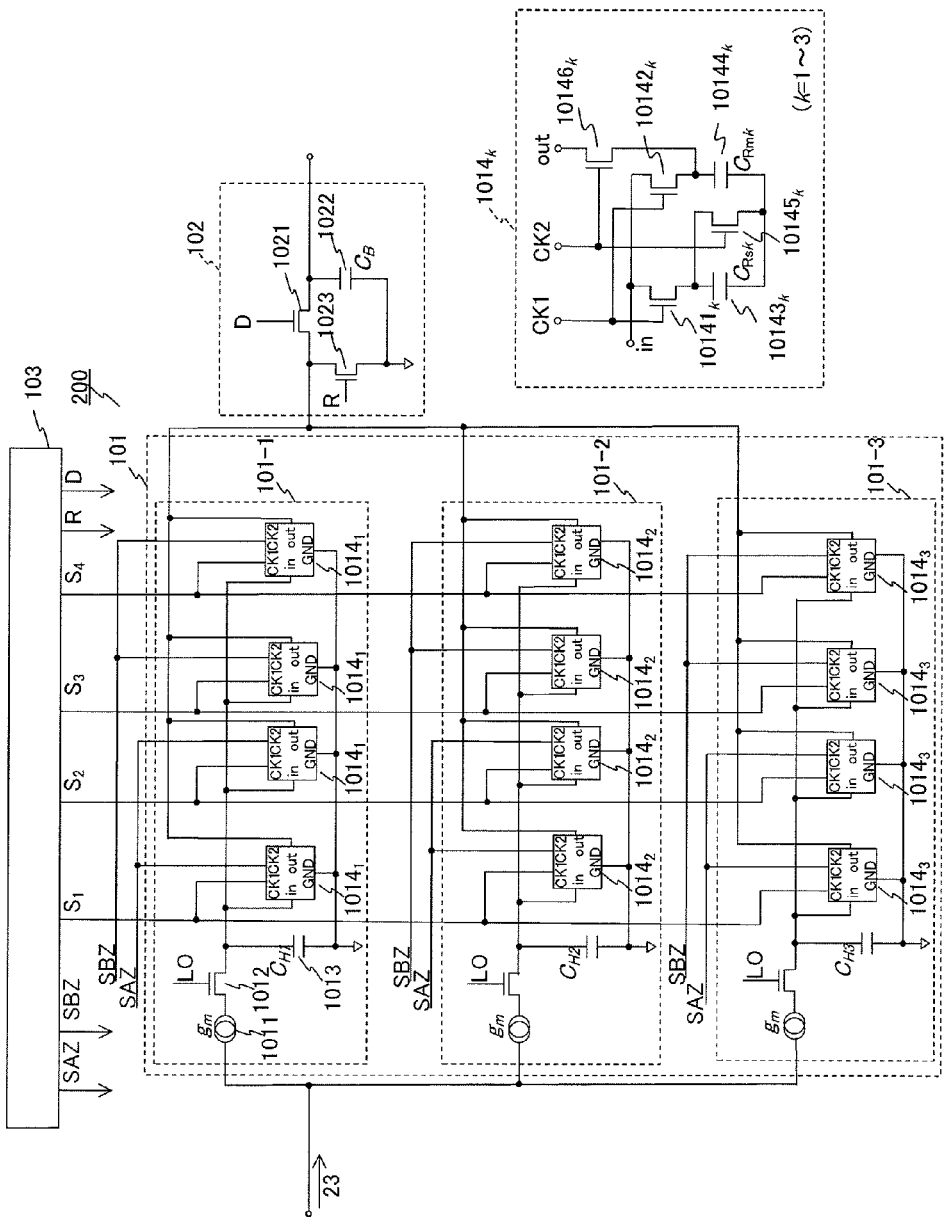
FIG. 9 is a connection diagram showing a configuration of a sampling circuit according to Embodiment 2.

FIG. 9 shows the configuration of a sampling circuit according to the present embodiment. In sampling circuit 200, the number of discrete time analog processing circuits 101-1 to 101-n connected in parallel in sampling circuit 100 shown in FIG. 6, is 3. Here, a case is shown as an example where the number (2×N) in each of discrete time analog processing circuits 101-1, 101-2 and 101-3 is, for example, 2×N=4 (i.e. N=2). In FIG. 9, the same components and actions as in FIG. 6 are assigned the same reference numerals and descriptions will be omitted.

Calculated element values often include negative coefficients. In these cases, it is preferable to switch between the positive phase and the negative phase of differential signals inputted to TA (transconductance amplifier) 1011 or buffer capacitor 1022.

Figure 10:
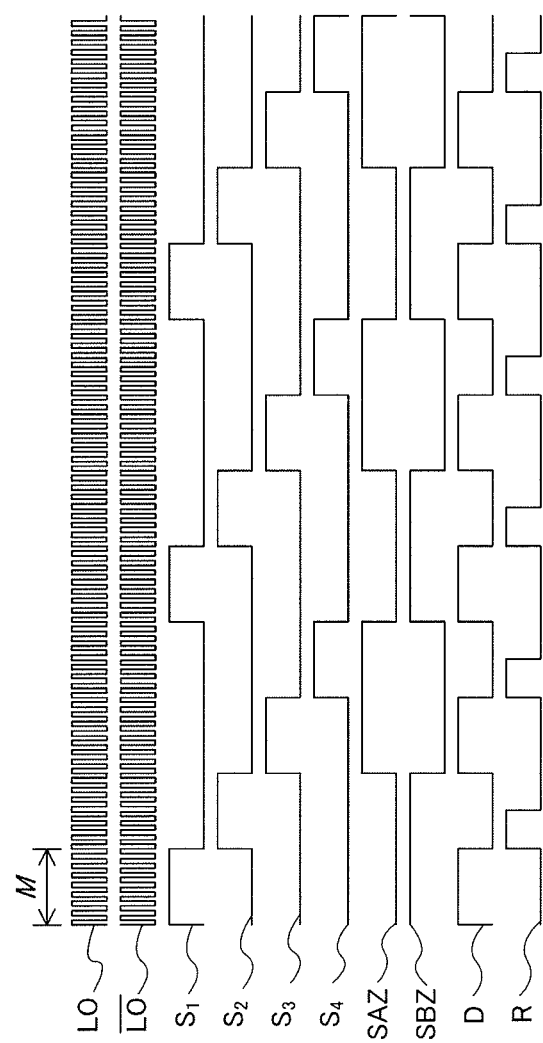
FIG. 10 is a timing chart showing control signals used in Embodiment 2.

FIG. 10 is a timing chart showing control signals outputted from digital control unit 103 and local frequency signals supplied to sampling switch 1012 in the present embodiment. Control signals $S_1$ to $S_4$ have high level periods shifted from each other, and each high level period is equivalent to M periods of a local frequency signal LO. With the present embodiment, M is set 8, for example.

Control signals $S_1$ to $S_4$ are sent to integration switches 10141 and 10142 in each of discrete time analog processing circuits 101-1, 101-2 and 101-3. Control signal SAZ and control signal SBZ are alternately in the high level and are sent to release switches 10145 and 10146 to allow two rotate capacitor units 1014 to connect with one another. Control signals SAZ and SBZ are sent to release switches 10145 and 10146 in each of discrete time analog processing circuits 101-1, 101-2 and 101-3. Control signal D and control signal R are sent to dump switch 1021 and reset switch 1023, respectively.

The filter characteristic realized in the entire sampling circuit 200 configured as described above, is equivalent to equation 5, where n=3.

In equation 5, part forming the third IIR filter characteristic includes three first-order low pass filters connected in parallel, so that it is possible to describe equation 6 with n=3.

Here, coefficient values of equation 6 are defined to provide attenuation poles at designated frequencies. Assume that the DC gain is D, $b_1$, $b_2$ and $b_3$ are any values and $\omega_N$ is the angular frequency of the attenuation pole, it is possible to derive $a_1$, $a_2$ and $a_3$ from the following equation.

(Equation 7)

$$\begin{bmatrix} a_1 \\ a_2 \\ a_3 \end{bmatrix} = \begin{vmatrix} \text{Re}\begin{bmatrix} (b_2+1-z_N^{-M}) \\ (b_3+1-z_N^{-M}) \end{bmatrix} & \text{Re}\begin{bmatrix} (b_1+1-z_N^{-M}) \\ (b_3+1-z_N^{-M}) \end{bmatrix} & \text{Re}\begin{bmatrix} (b_1+1-z_N^{-M}) \\ (b_2+1-z_N^{-M}) \end{bmatrix} \\ \text{Im}\begin{bmatrix} (b_2+1-z_N^{-M}) \\ (b_3+1-z_N^{-M}) \end{bmatrix} & \text{Im}\begin{bmatrix} (b_1+1-z_N^{-M}) \\ (b_3+1-z_N^{-M}) \end{bmatrix} & \text{Im}\begin{bmatrix} (b_1+1-z_N^{-M}) \\ (b_2+1-z_N^{-M}) \end{bmatrix} \\ 1/b_1 & 1/b_2 & 1/b_3 \end{vmatrix}^{-1} \begin{bmatrix} 0 \\ 0 \\ D \end{bmatrix}$$

[7]

where $z_n = \cos\omega_N^i + j\sin\omega_N^i$

By comparing the part forming the third IIR filter characteristic in equation 5, where n=3, with equation 6, it is possible to obtain equation 8, equation 9 and equation 10. Then, it is possible to derive the element value of each circuit element from equation 8, equation 9 and equation 10.

$$C_{Rm1}/(C_{Rm1}+C_{Rs1})=-(a_1b_2)/(a_2b_1), C_{Rm2}/(C_{Rm2}+C_{Rs2})=1, C_{Rm3}/(C_{Rm3}+C_{Rs3})=-(a_3b_2)/(a_2b_3)$$ (Equation 8)

$$C_{Rm1}+C_{Rs1}=b_1C_{H1}, C_{Rm2}+C_{Rs2}=b_2C_{H2}, C_{Rm3}+C_{Rs3}=b_3C_{H3}$$ (Equation 9)

where, $C_{H1}$, $C_{H2}$ and $C_{H3}$ are any values (Equation 10)

$$g_m = \frac{a_2(a_1+a_2+a_3)}{b_2(a_1+a_2+a_3)} \cdot \frac{\pi(C_{Rm1}+C_{Rm2}+C_{Rm3})}{MT_{LO}}$$ [10]

For example, by deriving each circuit element value in sampling circuit 200 from equation 8, equation 9 and equation 10, assuming conditions represented in equation 11, it is possible to calculate the value represented by equation 12.

$$f_{LO}=1 \text{ GHz}, b_1=0.2513, b_2=0.5027, b_3=0.7540, M=8,$$
$$N=1, C_{H1}=C_{H2}=C_{H3}=5 \text{ pF}, \omega_N=10 \text{ MHz}$$ (Equation 11)

$$g_m=49.655 \text{ mS}, C_{Rm1}=750.13 \text{ fF}, C_{Rs1}=506.50$$
$$\text{fF}, C_{Rm2}=2.5133 \text{ pF}, C_{Rs2}=0, C_{Rm3}=2.0174$$
$$\text{pF}, C_{Rs3}=1.7525 \text{ pF}$$ (Equation 12)

Figure 11A:
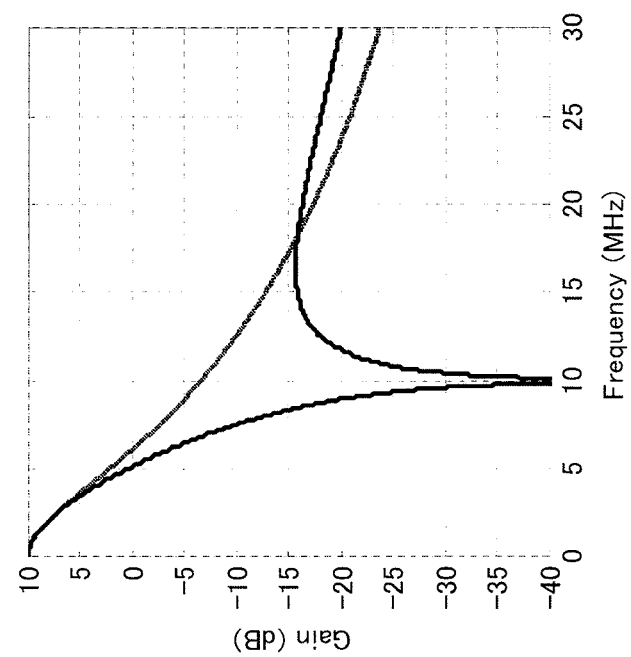
FIG. 11 is a characteristic diagram showing examples of a third IIR filter characteristic realized in Embodiment 2.
Figure 11B:
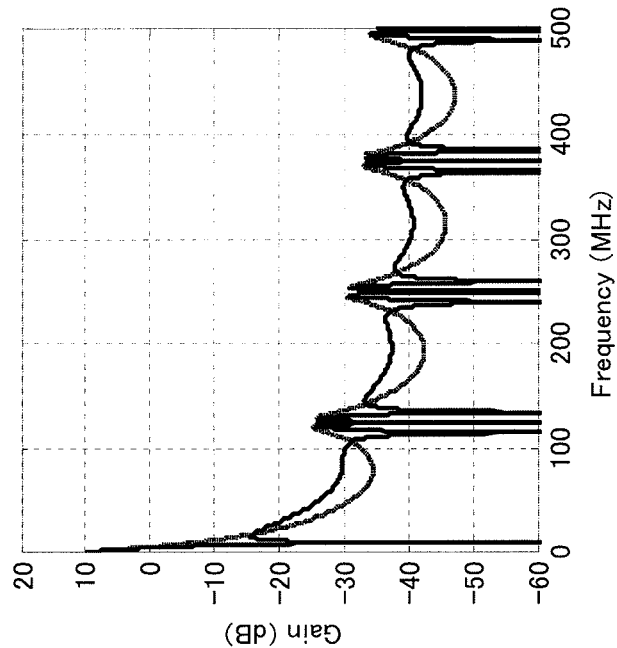

FIG. 11 shows the frequency response characteristic of the third IIR filter obtained when sampling circuit 200 with three parallel circuits shown in FIG. 9 uses the conditions shown in equation 11 and the circuit element values shown in equation 12, where the characteristic is represented by solid lines. Meanwhile, as a comparative example, dotted-lines represent the frequency response characteristic in a case in which a configuration with only one discrete time analog processing circuit is employed to limit the bandwidth to obtain attenuation of 3 dB (decibel) to one. It is possible to see from FIG. 11 that, by employing a configuration in which three parallel discrete time analog processing circuits are arranged, instead of a configuration with only one discrete time analog processing circuit, it is possible to secure a greater amount of attenuation in the cutoff frequency band without changing the gain in the pass frequency band. Here, the value of buffer capacitor 1022 is 10 pF at the time to calculate the characteristic.

During circuit implementation, it is necessary to realize negative coefficients in one discrete time analog processing circuit, so that some measures such as switching between the positive phase and the negative phase and so forth are required.

As described above, according to the present embodiment, a circuit configuration is adopted where three discrete time analog processing circuits 101-1, 101-2 and 101-3 are connected in parallel, and electrical charge signals obtained in respective circuits are added in buffer capacitor 1022. By this means, it is possible to increase the order of the IIR filter realized in sampling circuit 200, and therefore, it is possible to realize frequency response characteristics and bandpass characteristics to provide more significant frequency-to-attenuation characteristics.

Here, with the present embodiment, although a case has been shown where the number of discrete time analog processing circuits 101-1 to 101-$n$ is 3, the present invention is not limited to this number of circuits in parallel. Based on the subject matters disclosed in the above-described embodiments, it is possible to readily apply the present invention to a case in which the number of circuits in parallel is four or more, or two, naturally.

Embodiment 3

With the present embodiment, a configuration will be shown where it is possible to realize the sum of first-order IIR filter characteristics using a single TA (transconductance amplifier) 1011 across the entire circuit, like Embodiment 1. That is, although with Embodiment 1, each of a plurality of discrete time analog processing circuits 101-1 to 101-$n$ has one TA (transconductance amplifier) 1011 as shown in FIG. 6, one TA (transconductance amplifier) 1011 is shared across the entire sampling circuit according to the present embodiment.

Figure 12:
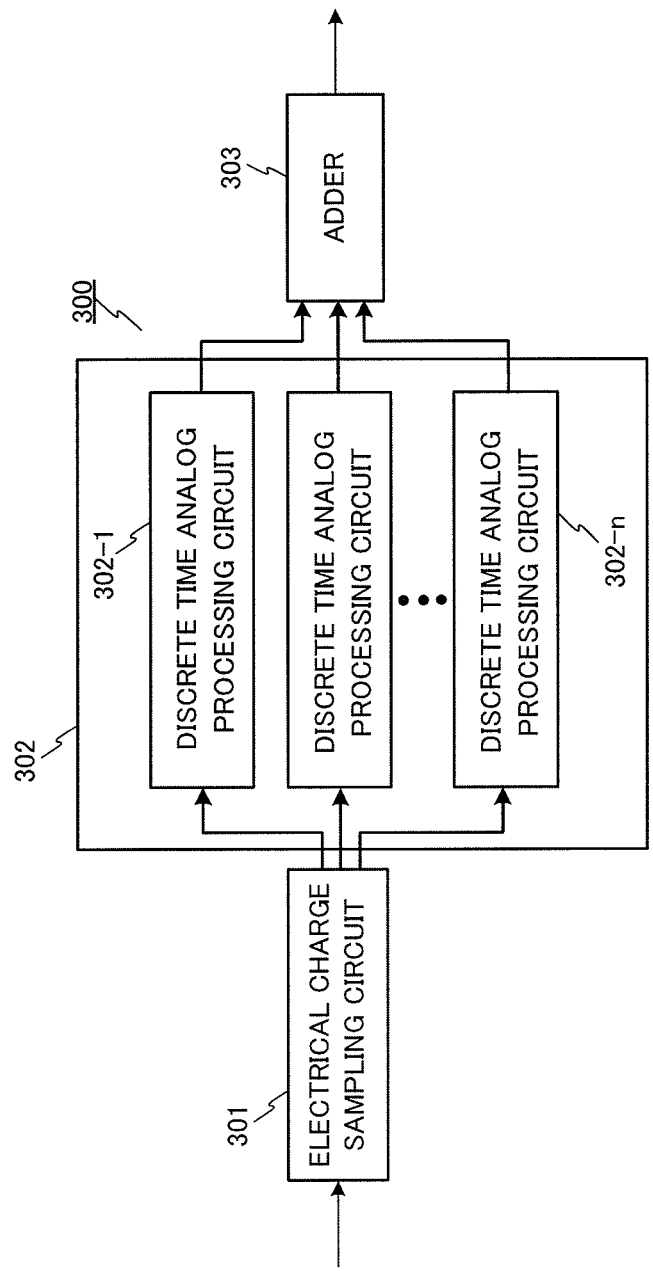
FIG. 12 is a connection diagram showing a configuration of a sampling circuit according to Embodiment 3.

FIG. 12 shows the configuration of a sampling circuit according to the present embodiment. Sampling circuit 300 in FIG. 12 is equivalent to sampling circuit 13 in FIG. 14. Sampling circuit 300 has electrical charge sampling circuit 301 that converts input voltage signals to current signals and samples them, discrete time analog processing circuit group 302 that has a plurality of discrete time analog processing circuits 302-1 to 302-$n$ arranged in parallel and performs discrete time analog processing, and adder 303 that adds outputs from discrete time analog processing circuits 302-1 to 302-$n$ and outputs the result. By individually setting respective circuit element values of discrete time analog processing circuits 302-1 to 302-$n$, it is possible to realize better filter frequency response characteristics with a configuration using a single TA (transconductance amplifier) than with a conventional sampling circuit having only one discrete time analog processing circuit.

Figure 13:
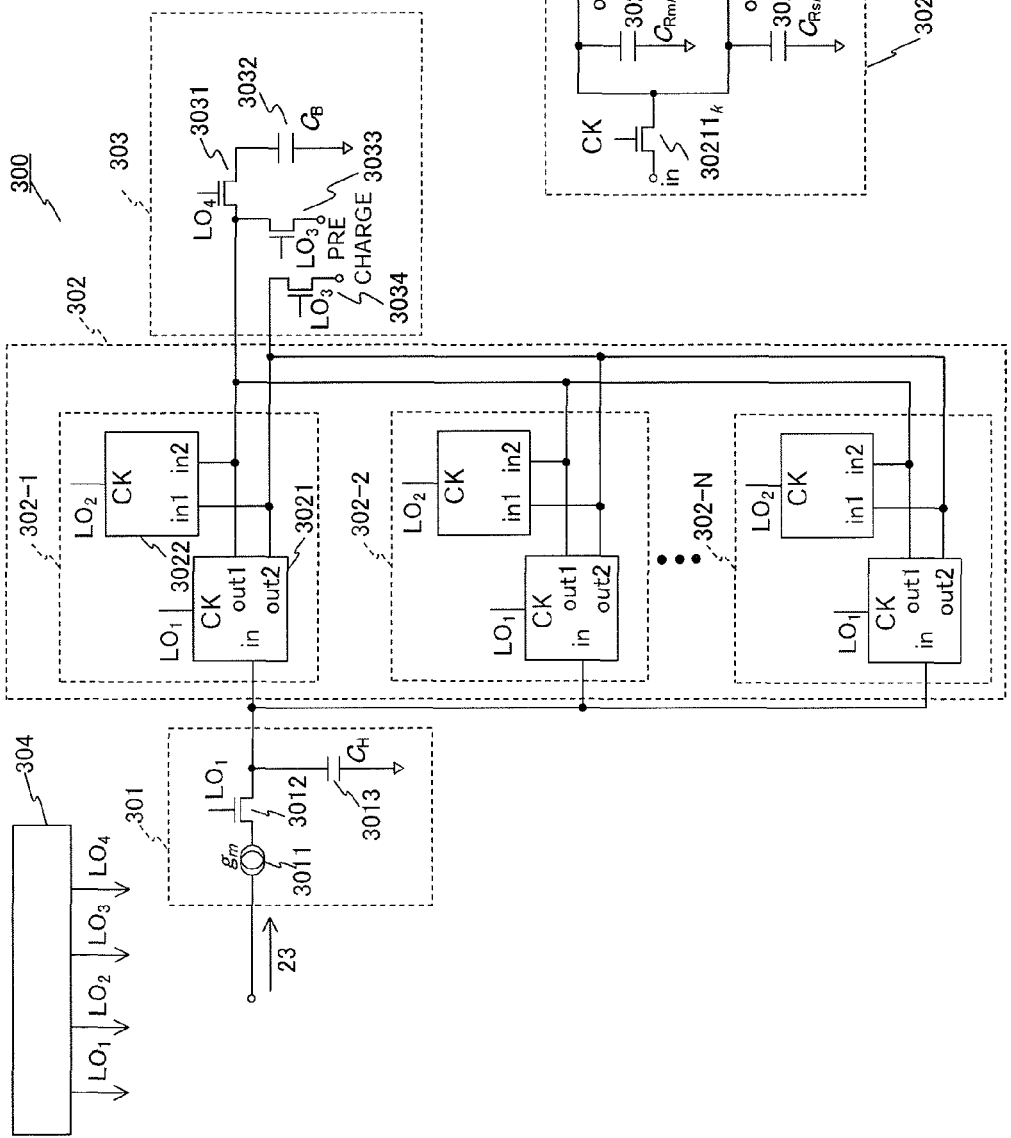
FIG. 13 is a connection diagram showing a specific configuration of the sampling circuit according to Embodiment 3.

FIG. 13A shows a specific configuration of the sampling circuit shown in FIG. 12. Sampling circuit 301 has TA (transconductance amplifier) 3011, sampling switch 3012 and history capacitor 3013.

Each of discrete time analog processing circuits 302-1 to 302-$n$ has rotate capacitor unit 3021 shown in FIG. 13B and buffer capacitor unit 3022 shown in FIG. 13C. Rotate capacitor unit 3021 has integration switch 30211, main rotate capacitor 30212 and sub-rotate capacitor 30213. Buffer capacitor unit 3022 has integration switches 30221 and 30222, and buffer capacitor 30223.

Adder 303 has dump switch 3031, buffer capacitor 3032, and reset switches 3033 and 3034.

Digital control unit 304 supplies control signals to electrical charge sampling circuit 301, discrete time analog processing circuits 302-1 to 302-$n$ and adder 303 to perform frequency conversion, decimation and filtering in sampling circuit 300 in order to produce desired characteristics.

Figure 14:
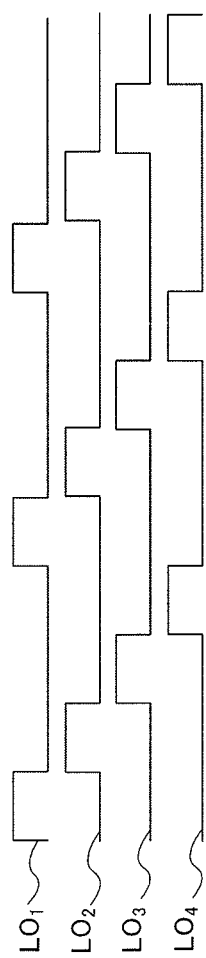
FIG. 14 is a timing chart showing control signals used in Embodiment 3.

FIG. 14 is a timing chart showing control signals $LO_1$ to $LO_4$ outputted from digital control unit 304. $LO_1$ to $LO_4$ have high level periods shifted from each other, each of which is ¼ of an input signal period.

Next, operations of sampling circuit 300 will be explained. First, electrical charge sampling circuit 301, and discrete time analog processing circuits 302-1 to 302-$n$ sample electrical charge of input analog RF signal 23. That is, analog RF signal 23, an inputted voltage signal, is converted to a current signal by TA (transconductance amplifier) 3011. The current signal is inputted to history capacitor 3013, main rotate capacitor 30212 and sub-rotate capacitor 30213 via sampling switch 3012 and integration switch 30211 in rotate capacitor unit 3021, and electrical charge is integrated during the period equal to ¼ of a desired input signal period. History capacitor 3013 holds the electrical charge at the time of last sampling as the initial state of sampling, so that it is possible to produce an IIR filter effect.

Next, in each of a plurality of discrete time analog processing circuits 302-1 to 302-$n$ arranged in parallel, rotate capacitor unit 3021 and buffer capacitor unit 3022 share electrical charge. That is, main rotate capacitor $30212_k$, sub-rotate capacitor $30213_k$, and buffer capacitor $30223_k$ share electrical charge by receiving, as input, electrical charge accumulated in main rotate capacitor $30212_k$ and sub-rotate capacitor $30213_k$, via integration switches $30221_k$ and $30222_k$. Buffer capacitor $30223_k$ holds the electrical charge at the time of last electrical charge sharing, as the initial state of electrical charge supply, so that it is possible to produce an IIR filter effect.

Next, electrical charge is shared between main rotate capacitor $30212_k$ in each of a plurality of discrete time analog processing circuits 302-1 to 302-$n$ arranged in parallel and buffer capacitor 3032 in adder 303. That is, main rotate capacitor $30212_k$ and buffer capacitor 3032 share electrical charge by receiving, as input, electrical charge accumulated in main rotate capacitors $30212_{1\ to\ N}$, via dump switch 3031. This electrical charge sharing allows a passive circuit to output the adding result of outputs from discrete time analog processing circuits 302-1 to 302-$n$. In addition, buffer capacitor 3032 holds the electrical charge at the time of last electrical charge sharing, as the initial state of electrical charge supply, so that it is possible to produce an IIR filter effect.

Finally, the potentials of main rotate capacitor $30212_k$ and sub-rotate capacitor $30313_k$ are reset through reset switches 3033 and 3034 to set the potential allowing sampling switch 3012 to correctly operate.

By repeating the above-described operation, it is possible to provide a transfer function represented by equation 13.

(Equation 13)

$$H(z) = \frac{g_m T_S}{\sqrt{2}\pi \sum_{k=1}^{n} C_{Rmk}} \cdot \frac{\sum_{k=1}^{n} C_{Rmk}/C_B}{\sum_{k=1}^{n} C_{Rmk}/C_B + 1 - z^{-1}} \cdot \sum_{k=1}^{n} \left( \frac{\frac{z^{-1}(C_{Rmk}+C_{Rsk})/C_H}{(C_{Rmk}+C_{Rsk})/C_H + 1 - z^{-1}} \cdot}{\frac{z^{-1}C_{Rmk}/C_{B1k}}{(C_{Rmk}+C_{Rsk})/C_{B1k} + 1 - z^{-1}}} \right) \quad [13]$$

Here, $g_m$ represents the $g_m$ value of TA (transconductance amplifier) 3011. In addition, $T_s$ represents the period of a local (LO) signal. Moreover, $C_H$ is the capacitance value of history capacitor 3013, $C_{Rmk}$ is the capacitance value of main rotate capacitor 30212, $C_{Rsk}$ is the capacitance value of sub-rotate capacitor 30213, $C_{B1}$ is the capacitance value of buffer capacitor 30223 in buffer capacitor unit 3022 and $C_B$ is the capacitance value of buffer capacitor 3032 in adder 303.

Moreover, assume that $C_{Rmk}+C_{Rsk}=C_R$, it is possible to describe equation 14.

(Equation 14)

$$H(z) = \frac{g_m T_S}{\sqrt{2}\pi \sum_{k=1}^{n} C_{Rmk}} \cdot \frac{z^{-1}C_R/C_H}{C_R/C_H + 1 - z^{-1}} \cdot \frac{\sum_{k=1}^{n} C_{Rmk}/C_B}{\sum_{k=1}^{n} C_{Rmk}/C_B + 1 - z^{-1}} \cdot \sum_{k=1}^{n} \left( \frac{z^{-1}C_{Rmk}/C_{B1k}}{(C_{Rmk}+C_{Rsk})/C_{B1k} + 1 - z^{-1}} \right) \quad [14]$$

As seen from equation 14, with a configuration using single TA (transconductance amplifier) 3011, it is possible to realize the sum of first-order filter IIR filter characteristics in which coefficients are determined based on the capacitance ratio between circuit elements. By this means, it is possible to realize a circuit configuration which can be easily designed and has resistance to variations in semiconductor process.

As described above, according to the present embodiment, a circuit configuration is adopted where a plurality of discrete time analog processing circuits 302-1 to 302-n are connected in parallel and are connected to electrical charge sampling circuit 301, and respective electrical charge signals obtained in discrete time analog processing circuits 302-1 to 302-n are added in buffer capacitor 3032, and main rotate capacitor 30212 and sub-rotate capacitor 30213 are used in each of discrete time analog processing circuits 302-1 to 302-n, so that it is possible to realize the sum of first-order IIR filter characteristics in single electrical charge sampling circuit 301 and determine the coefficient values based on capacitance ratios.

By this means, it is possible to perform weighting according to the capacitance ratio suitable for semiconductor process in a circuit configuration using a single electrical charge sampling circuit. In addition, the kinds and numbers of circuit element values able to be set in filter design, so that it is possible to dramatically improve the flexibility of filter design. In particular, the number of discrete time analog processing circuits arranged in parallel is adequately set depending on the filter performance required for a receiver, so that it is possible to randomly set the number of attenuation poles and the positions in the frequency domain, and therefore realize filter characteristics supporting reception of wideband signals.

Moreover, with the above-described circuit configuration, it is possible to reduce unnecessary harmonic response by using signals having high level periods shifted from each other, each of which is equal to ¼ of an input signal period, as $LO_1$ to $LO_4$. This is enabled in a case in which a sampling circuit has a single discrete time analog processing circuit.

The disclosure of Japanese Patent Application No. 2008-308953, filed on Dec. 3, 2008, including the specification, drawings and abstract, is incorporated herein by reference in its entirety.

INDUSTRIAL APPLICABILITY

The direct sampling circuit and receiver according to the present invention is useful for a high-frequency signal processing circuit in the receiving section in a radio communication apparatus and is appropriate for signal frequency conversion and filtering processing.

| Reference Signs List | |
|---|---|
| 10 | Sampling receiver |
| 12 | Low noise amplifier |
| 13, 100, 200, 300 | Sampling circuit |
| 101, 302 | Discrete time analog processing circuit group |
| 101-1 to 101-n, 302-1 to 302-n | Discrete time analog processing circuit |
| 1011, 3011 | TA (transconductance amplifier) |
| 1012, 3012 | Sampling switch |
| 1013, 3013 | History capacitor |
| 1014, 3021 | Rotate capacitor unit |
| 10141, 10142, 30211, 30221, 30222 | Integration switch |
| 10143, 30213 | Sub-rotate capacitor |
| 10144, 30212 | Main rotate capacitor |
| 10145, 10146 | Release switch |
| 102, 303 | Adder |
| 1021, 3031 | Dump switch |
| 1022, 3022, 30223 | Buffer capacitor |
| 1023, 3033 | Reset switch |
| 103, 304 | Digital control unit |
| 301 | Electrical charge sampling circuit |
| 3022 | Buffer capacitor unit |

The invention claimed is:

1. A sampling circuit, comprising:
   an electrical charge sampling circuit having a sampling switch that samples an inputted signal and a history capacitor connected to the sampling switch;
   a group of a plurality of discrete time analog processing circuits arranged in parallel, each having a rotate capacitor unit and a buffer capacitor unit;
   an adding section that adds outputs from the group of the discrete time analog processing circuits and outputs a result; and
   a digital control unit that outputs a plurality of control signals to control operation of the group of the discrete time analog processing circuits and operation of the adding section, wherein:
   the rotate capacitor unit has a first integration switch, a main rotate capacitor and a sub-rotate capacitor connected to the first integration switch in parallel; and
   the buffer capacitor unit has a second integration switch and a buffer capacitor connected to the second integration switch;

at a timing electrical charge accumulated in the history capacitor is inputted to the rotate capacitor unit, the main rotate capacitor and the sub-rotate capacitor are connected to the history capacitor in parallel via the first integration switch; and at a timing electrical charge is outputted from the rotate capacitor unit to the adding section, only the main rotate capacitor is connected to the adding section.

2. The sampling circuit according to claim 1,
wherein at a timing the rotate capacitor unit and the buffer capacitor unit are connected with one another, the main rotate capacitor and the sub-rotate capacitor are connected to the buffer capacitor in parallel.

3. The sampling circuit according to claim 1,
wherein the adding section further includes a third integration switch, an output buffer capacitor connected to the third integration switch and a reset switch to reset the main rotate capacitor and the sub-rotate capacitor.

4. The sampling circuit according to claim 1,
wherein the electrical charge sampling circuit further includes a transconductance amplifier that converts an inputted voltage signal to a current signal.

5. The sampling circuit according to claim 1,
wherein an interval to perform electrical charge sampling is ¼ of a desired signal period, and the sampling circuit repeats following steps of:

in a first interval ¼ of the period, sampling electrical charge of an input signal by the history capacitor and a main rotate capacitor and a sub-rotate capacitor in the rotate capacitor unit;

in a next interval ¼ of the period, sharing electrical charge between the main rotate capacitor and the sub-rotate capacitor in the rotate capacitor unit and a buffer capacitor in the buffer capacitor unit;

in a subsequent interval ¼ of the period, sharing electrical charge between the main rotate capacitor in the rotate capacitor unit and the output buffer capacitor included in the adding section; and in a final interval ¼ of the period, precharging the main rotate capacitor and the sub-rotate capacitor included in the rotate capacitor unit.

6. The sampling circuit according to claim 1,
wherein, in the group of the discrete time analog processing circuits, a capacitance of the main rotate capacitor and a capacitance of the sub-rotate capacitor included in each of the plurality of rotate capacitor units included in a first discrete time analog processing circuit differ from a capacitance of the main rotate capacitor and a capacitance of the sub-rotate capacitor included in each of the plurality of rotate capacitor units included in a second discrete time analog processing circuit different from the first discrete time analog processing circuit, respectively.

7. The sampling circuit according to claim 1,
wherein in the discrete time analog signal processing circuit, at least one of the history capacitor, and the main rotate capacitor and the sub-rotate capacitor included in the rotate capacitor unit, has a variable capacitance value.

8. A receiver comprising:
a sampling circuit according to claim 1;
an analog to digital conversion processing section that quantizes and converts a baseband signal outputted from the sampling circuit, into a digital baseband signal; and
a digital reception processing section that performs demodulation processing on the digital baseband signal and outputs received data.

\* \* \* \* \*